(12) United States Patent
Yamamoto et al.

(10) Patent No.: US 6,660,406 B2
(45) Date of Patent: Dec. 9, 2003

(54) METHOD FOR MANUFACTURING PRINTED WIRING BOARD COMPRISING ELECTRODEPOSITED COPPER FOIL WITH CARRIER AND RESISTOR CIRCUIT; AND PRINTED WIRING BOARD COMPRISING RESISTOR CIRCUIT

(75) Inventors: Takuya Yamamoto, Ageo (JP); Takashi Kataoka, Ageo (JP); Naotomi Takahashi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 102 days.

(21) Appl. No.: 09/885,552

(22) Filed: Jun. 20, 2001

(65) Prior Publication Data

US 2002/0004123 A1 Jan. 10, 2002

(30) Foreign Application Priority Data

Jul. 7, 2000 (JP) .................................. 2000-207016

(51) Int. Cl.[7] .............................. B21C 37/00; C23F 1/00
(52) U.S. Cl. ........................ 428/615; 428/607; 428/209; 216/41; 216/74; 216/75
(58) Field of Search ................................ 428/209, 607, 428/615, 626; 216/41, 74, 75

(56) References Cited

U.S. PATENT DOCUMENTS

| | | | | |
|---|---|---|---|---|
| 3,998,601 A | * | 12/1976 | Yates et al. .................... 29/195 |
| 4,517,546 A | * | 5/1985 | Kakuhashi et al. .......... 338/320 |
| 4,532,186 A | * | 7/1985 | Shibagaki et al. ........... 428/457 |
| 4,540,463 A | * | 9/1985 | Kakuhashi et al. .......... 156/630 |
| 4,572,768 A | * | 2/1986 | Wolski et al. .................. 204/15 |
| 5,262,247 A | * | 11/1993 | Kajiwara et al. ............. 428/607 |
| 5,989,727 A | * | 11/1999 | Yates et al. ................... 428/607 |
| 6,258,449 B1 | * | 7/2001 | Nagasawa et al. ........... 428/209 |
| 6,319,620 B1 | * | 11/2001 | Kataoka et al. .............. 428/626 |
| 6,329,074 B1 | * | 12/2001 | Fujiwara et al. ............. 428/632 |
| 6,346,335 B1 | * | 2/2002 | Chen et al. ................... 428/629 |

* cited by examiner

*Primary Examiner*—Cathy Lam
(74) *Attorney, Agent, or Firm*—Roberts & Mercanti, LLP

(57) ABSTRACT

There are provided an electrodeposited copper foil with carrier that can be used for manufacturing a printed wiring board that excels in the finished accuracy of the resistor circuit in comparison with a conventional printed wiring board with resistor circuits, and a method for manufacturing such a printed wiring board with resistor circuits. The method for manufacturing a printed wiring board with resistor circuits comprises the steps of previously forming copper foil circuits using a copper foil for a printed wiring board with resistor circuits comprising a nickel layer for forming a resistor circuit between a copper carrier and a copper foil layer for forming the circuit, whose surface layer is subjected to a nodular treatment, using a copper etching solution that does not etch the nickel layer; fabricating a copper clad laminate using the copper foil after forming the copper circuits, and a prepreg composing a resin base material; removing the copper carrier to expose the nickel layer for forming the resistor circuit, and etching the resistor circuits to form the nickel resistor-circuits.

9 Claims, 7 Drawing Sheets

(a) Forming a Copper Etching Resist Layer (b) Exposing and Developing of a Copper Etching Resist Layer

FIG. 3

(c) Etching of Copper Circuits (d) Releasing of a Copper Etching Resist Layer

FIG. 4

(e) Manufacturing of a Copper Clad Laminate

FIG. 5

(f) Etching of a Copper Carrier (g) Forming a Nickel Etching Resist Layer

FIG. 6

(h) Exposing and Developing of Nickel Etching Resist Layer (i) Etching of Nickel Layer

FIG. 7

(j) Removal of a Nickel Etching Resist Layer

METHOD FOR MANUFACTURING PRINTED WIRING BOARD COMPRISING ELECTRODEPOSITED COPPER FOIL WITH CARRIER AND RESISTOR CIRCUIT; AND PRINTED WIRING BOARD COMPRISING RESISTOR CIRCUIT

BACKGROUND OF THE INVENTION

1. Field of the Invention

The present invention relates to a method for manufacturing a copper foil for forming a resistor circuit used in the manufacture of a printed wiring board with nickel resistor circuits, and a printed wiring board comprising such a resistor circuit; and to a printed wiring board comprising such a resistor circuit.

2. Description of the Prior Art

Such a printed wiring board with resistor circuits is used in electric and electronic equipment that requires resistance control. Particularly with a rapid increase in the clock frequencies of computers in recent years, a resistor circuit of considerably high accuracy has been demanded increasingly on a circuit substrate.

It has been pointed out that the thickness of the nickel layer forming the resistor circuit should be uniform, and the width of the resistor circuit should be uniformly controlled in order to improve the accuracy of the finished resistor circuit, and is a matter of course in considering the electrical resistance of metals.

A conventional printed wiring board with resistor circuits has been manufactured by forming a nickel layer for forming the resistor circuit on a surface of a base material used for bonding a copper that has undergone a nodular treatment (a treatment for depositing fine copper grains to obtain the anchoring effect), forming copper foil circuits on the copper foil side or forming a resistor circuit on a nickel layer for forming the resistor circuit, and bonding the nickel layer to the base material.

Alternatively, there has generally been adopted a method for manufacturing a printed wiring board with resistor circuits by forming copper foil circuits on a copper foil layer using an electrodeposited copper foil with carrier, bonding the copper foil circuits on a base material, removing the carrier, thereafter forming a nickel layer for forming the resistor circuit using a plating method, and forming nickel resistor circuits using an etching method.

However, since the above-described method for manufacturing a printed wiring board with resistor circuits, by using a copper foil having a nickel layer for the resistor circuit formed on the nodulated surface side used for bonding the copper foil on the base material, is affected by the uneven nodulated surface, the thickness of the nickel layer easily become uneven, and a resistor circuit of high accuracy cannot been formed.

Also when an electrodeposited copper foil with carrier is used, there has been a problem that the dimensional accuracy as a printed wiring board is deteriorated when the carrier consisting of a different metal such as aluminum is removed after copper foil circuits are formed in the state of an electrodeposited copper foil with carrier, and bonding the copper foil to the base material.

SUMMARY OF THE INVENTION

The present inventors conducted repeated studies, and discovered a method for an electrodeposited copper foil with carrier that can be used for manufacturing a printed wiring board with resistor circuits having an excellent accuracy of the completed resistor circuit and an excellent dimensional stability of the completed printed wiring board; and a method for manufacturing such a printed wiring board with resistor circuits. The present invention will be described below.

Figure 1:
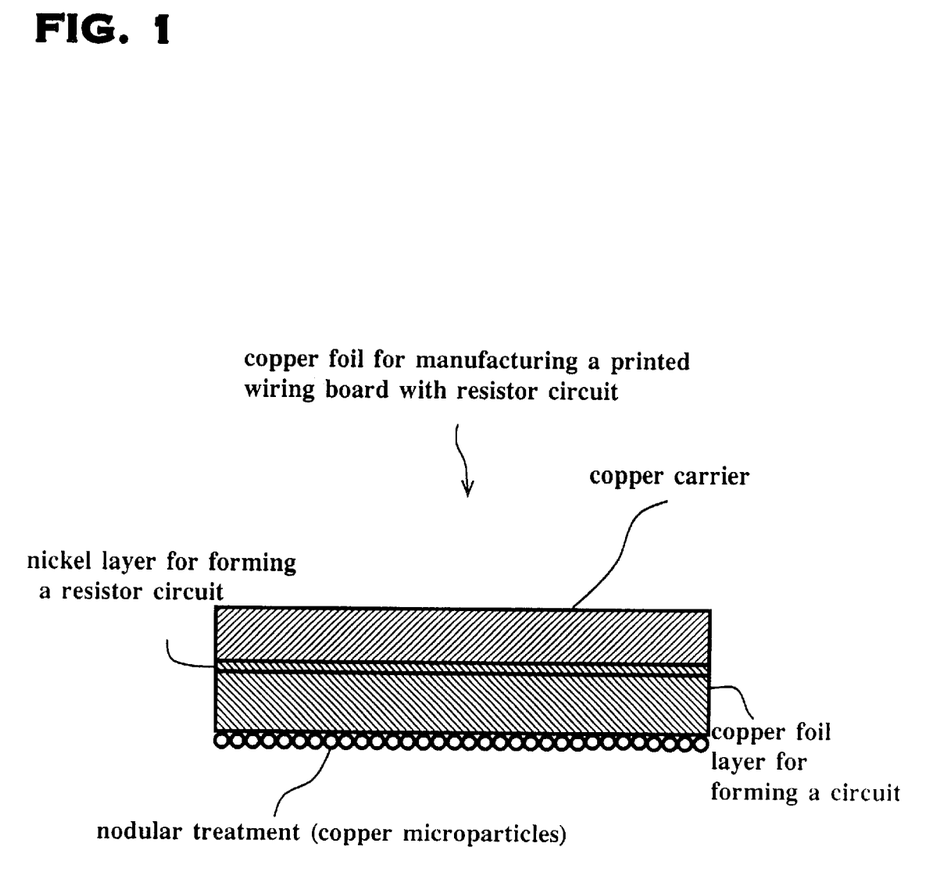
FIG. 1 is a schematic sectional view showing a composite copper foil with carrier.

The invention is a composite copper foil with carrier for manufacturing a printed wiring board with resistor circuits comprising a metal layer for forming the resistor circuit between a copper carrier and a copper layer for forming the circuit. The metal layer for forming the resistor circuit is characterized to be a nickel layer or a nickel alloy layer. A schematic sectional view showing the composite copper foil with carrier is shown in FIG. 1. When the cross-section is viewed, a nickel layer or a nickel alloy layer to be a metal layer for forming the resistor circuit is positioned in the location sandwiched between the copper carrier and the copper layer for forming the circuit. Although FIG. 1 shows the outer surface of the copper layer for forming the circuit that has undergone a nodular treatment, this nodular treatment is optional. As is obvious from the following description of the manufacturing method, since the copper foil circuits formed of the copper layer for forming the circuit of the composite copper foil with carrier according to the present invention is embedded when processed into a printed wiring board, the bonding strength of the copper foil circuits to an insulating material does not become an issue even if the nodular treatment is omitted. The nodular treatment is a treatment to deposit copper microparticles by burn plating of copper in the same manner as normally conducted to the bonding surface of copper foil, and to fix these copper microparticles by level plating of copper to prevent the separation of these copper microparticles. Since the copper carrier is made of the same material as the copper foil layer for forming the circuit, such a structure can minimize the dimensional change of the substrate after removing the carrier. Furthermore, since the nickel layer or the nickel alloy layer to be a metal layer for forming the resistor circuit is formed on the flat surface of the copper foil, a fine resistor circuit can be formed, the degree of freedom for the design of the resistor circuit increases, and the stability of the resistance values is improved.

A so called copper foil is used as the copper carrier and it may be formed of either an electrodeposited copper foil or a rolled copper foil. The composite copper foil with carrier according can use the copper foil layer itself for the carrier as the conductor. Therefore, when the metal layer for forming the resistor circuit and the copper foil layer for forming the circuit is manufactured by the electrodepositing method, the copper carrier can be used as the base material for electrodepositing the nickel layer or the nickel alloy layer to be a metal layer for forming the resistor circuit and the copper foil layer for forming the circuit on the surface of the copper carrier, by cathode-polarizing the copper carrier in a prescribed solution. Also, when the metal layer for forming the resistor circuit and the copper layer for forming the circuit are manufactured by sputtering or vapor deposition, the copper carrier can be used as an electrode to impress a voltage to the facing electrode, and nickel for forming the metal layer for forming the resistor circuit, and copper for forming the copper foil layer for forming the circuit can be deposited efficiently on the surface of the copper carrier.

Since the surfaces of the copper carrier and the copper foil layer for forming the circuit are normally exposed to the air, rust prevention treatment is generally performed for preventing oxidation during hot pressing for manufacturing a copper clad laminate, using an inorganic element such as zinc or a zinc alloy, or an organic agent such as benzotriazole or imidazole to secure the storage stability of the composite copper foil with carrier for a long period of time. When copper microparticles are formed and the nodular treatment is performed, the same rust prevention treatment is performed on the surface after the nodular treatment. However, since such a rust prevention layer is an extremely thin film, it is omitted from the description of the composite copper foil with carrier.

The composite copper foil with carrier is used for manufacturing a printed wiring board with resistor circuits using the etching method that will be described later. Therefore, the thickness of the nickel layer or the nickel alloy layer to be a metal layer for forming the resistor circuit provided between the copper carrier and the copper foil layer for forming the circuit is adequately determined in consideration of the manufacturing method. However, the composite copper foil with carrier, may be of a peelable type from which the carrier can be released. In such a case, a metal layer, an organic layer, or another inorganic layer may be provided as an interface layer between the copper carrier and the metal layer for forming the resistor circuit.

The thickness of said nickel layer or nickel alloy layer to be the metal layer for forming the resistor circuit in the composite copper foil with a carrier according to claim 1 is 0.01 $\mu$m to 4 $\mu$m. The electrochemically deposited nickel layer or nickel alloy layer is known to excel in deposition stability, and to form a uniform film with very little deposition defect in comparison with other metals. Particularly according to electroless plating, more stable deposition can be achieved when a nickel layer or a nickel alloy layer is formed. Therefore, it is practically possible to form a metal layer for forming a resistor circuit having a thickness thinner than 0.01 $\mu$m. In order to secure the mechanical strength of the nickel resistor circuits that is sufficient for practical use, it is considered that a thickness of at least about 1 $\mu$m is required. On the other hand, if a thinner nickel layer or nickel alloy layer can be formed, an excellent area resistance can be obtained even if the width of the resistor circuit is large. Therefore, the present inventors considered to make the nickel layer or nickel alloy layer as thin as possible, and decided the value of 0.01 $\mu$m as the limit to be able to form a thin film without defects, and to recognize as a thickness. In order to form a metal layer for forming a resistor circuit having a thickness thinner than 1 $\mu$m, the use of a physical procedure such as vapor deposition and sputtering is also useful. Also, when the thickness of the metal layer for forming the resistor circuit thinner than 1 $\mu$m is confirmed, it is preferable to measure the thickness as a calculated thickness by dissolving only the metal layer for forming the resistor circuit, in addition to the procedure such as the use of the film thickness gauge.

Whereas, the reason why the upper limit is decided to 4 $\mu$m is as follows: The larger the thickness of the metal layer for the resistor circuit, the smaller the electrical resistance determined by the cross-sectional area of the resistor circuit. Therefore, the thickness of the metal layer for forming the resistor circuit should primarily be determined optionally by the design resistance. However, since the composite copper foil with carrier according to the present invention is used for manufacturing a printed wiring board with resistor circuits using the etching method that will be described later, the copper foil must have an adequate thickness that can form a preferable resistor circuit by etching. If the thickness of the metal layer for the resistor circuit becomes excessive at this time, the etching factor of the metal layer for the resistor circuit will be deteriorated. That is, if the thickness of the metal layer for the resistor circuit exceeds 4 $\mu$m, the etching factor becomes deteriorated, the linearity of the edge of the resistor circuit is rapidly deteriorated, and the stability of the profile of the resistor circuit starts to be lost.

The nickel alloy layer to be the metal layer for forming the resistor circuit in the composite copper foil with a carrier, is made of a nickel-based alloy that contains at least one selected from a group consisting of phosphorus, boron, sulfur, titanium, vanadium, chromium, manganese, iron, cobalt, zinc, molybdenum, tungsten, tin, antimony, and copper.

The purpose of using the nickel-based alloy layer is that a higher resistance value is expected in comparison with the metal layer for forming the resistor circuit that used nickel alone. Therefore, if the nickel-based alloy layer has the same thickness and the same circuit width as the nickel layer, the nickel-based alloy layer has a higher resistance value, and can be designed as a thicker circuit. Such a thick circuit is difficult to cause breaking of wiring in comparison with a thin circuit. The nickel-based alloy is an alloy based on nickel and contains at least one of other alloy elements.

The alloy elements used here are selected from a group consisting of phosphorus, boron, sulfur, titanium, vanadium, chromium, manganese, iron, cobalt, zinc, molybdenum, tungsten, tin, antimony, and copper. These alloy elements can be used alone, or in combination of two or more. In particular, the addition of 10% by weight or more phosphorus in nickel is preferable, because the nickel becomes amorphous, and shows a very high resistance value. The addition of a trace of antimony also significantly increases the resistance value of nickel. There is no limit in the quantities of these alloy elements, and the composition that can achieve the desired resistance value may be selected in consideration of the design of the resistor circuit.

The invention is a method for manufacturing a printed wiring board with resistor circuits comprising copper foil circuits and resistor circuits using a composite copper foil with a carrier comprising a nickel layer or a nickel alloy layer for forming a resistor circuit, comprising the steps of forming a copper etching resist layer on the surface of said copper foil for forming the circuit of the composite copper foil with a carrier, and exposing and developing the circuit pattern of the copper foil circuits to be formed on said copper etching resist layer; forming the copper foil circuits by etching the copper foil for forming the circuit using a copper etching solution that does not dissolve the nickel layer or the nickel alloy layer; removing the copper etching resist layer; fabricating a copper clad laminate by laminating the composite copper foil with a carrier on the material for composing an insulating layer in the state where the surface of the composite copper foil with a carrier on which the copper foil circuits are formed contacts the insulating layer composing material; removing the copper carrier positioned on the outer layer of said copper clad laminate to expose the nickel layer or the nickel alloy layer for forming the resistor circuit; forming a nickel etching resist layer on said nickel layer or nickel alloy layer, and exposing and developing the resistor circuit pattern; forming the resistor circuit by resistor-circuit etching using a selective etching solution for nickel or nickel alloy; and removing the nickel etching resist layer.

Figure 2:
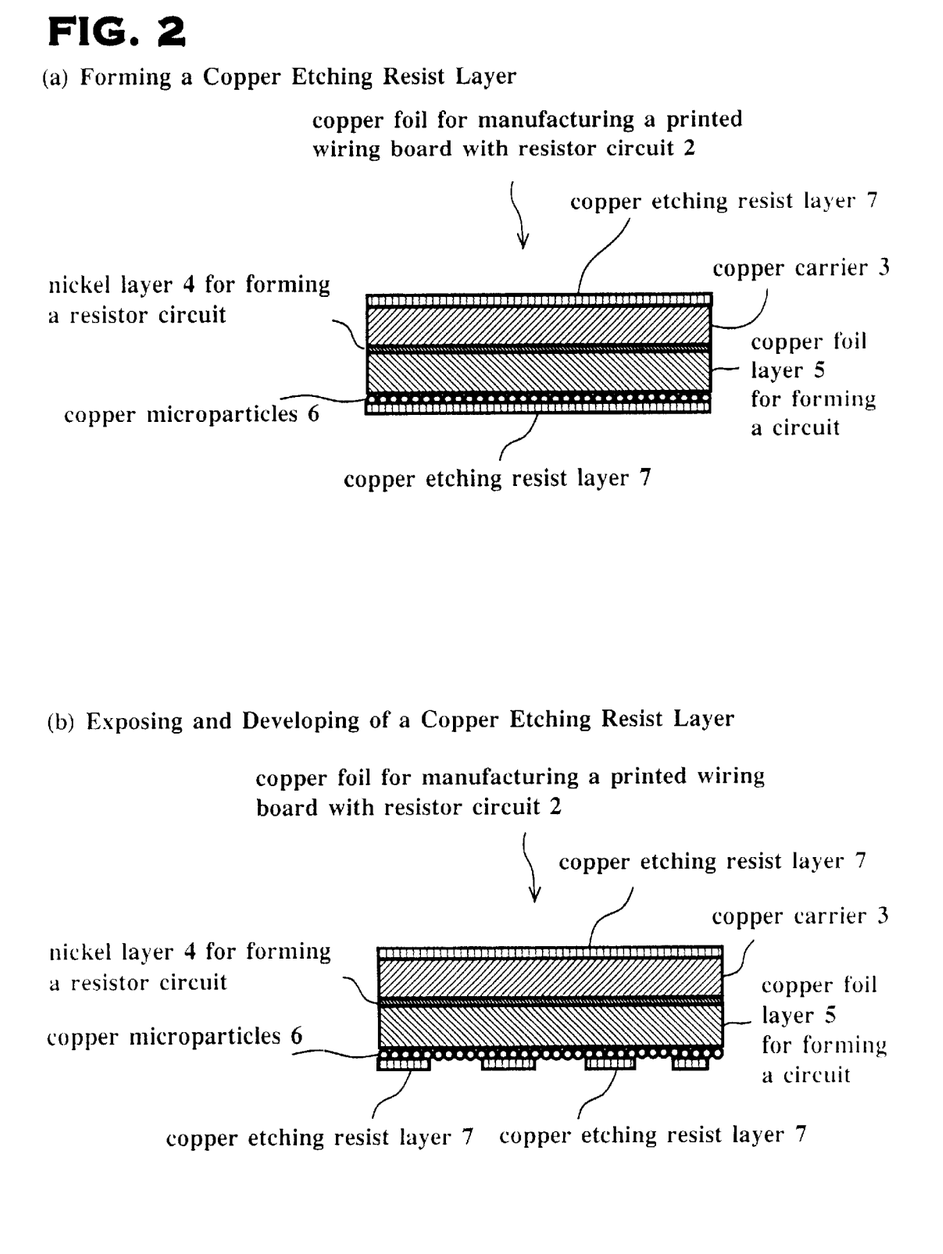
FIGS. 2 through 7 are conceptual diagrams showing the flow of manufacturing a printed wiring board with resistor circuits.

This manufacturing method will be described in order below referring to FIGS. 2 to 7. The manufacturing method begin with the state of a composite copper foil with carrier, and a copper etching resist layer is formed on the surface that has undergone the nodular treatment of the copper foil for forming the circuit. The etching resist layer can be formed using a dry film, a liquid resist, or the like, but the materials are not limited to the above. FIG. 2(a) shows the above-described step. Then, a circuit pattern to be copper foil circuits formed on the copper etching resist layer is exposed and developed as shown in FIG. 2(b). At this time, it is preferable to form a copper etching resist layer or a backup film layer over the entire surface of the copper carrier as FIGS. 2(a) and (b) show, so as not to be damaged by the etching solution.

Figure 3:
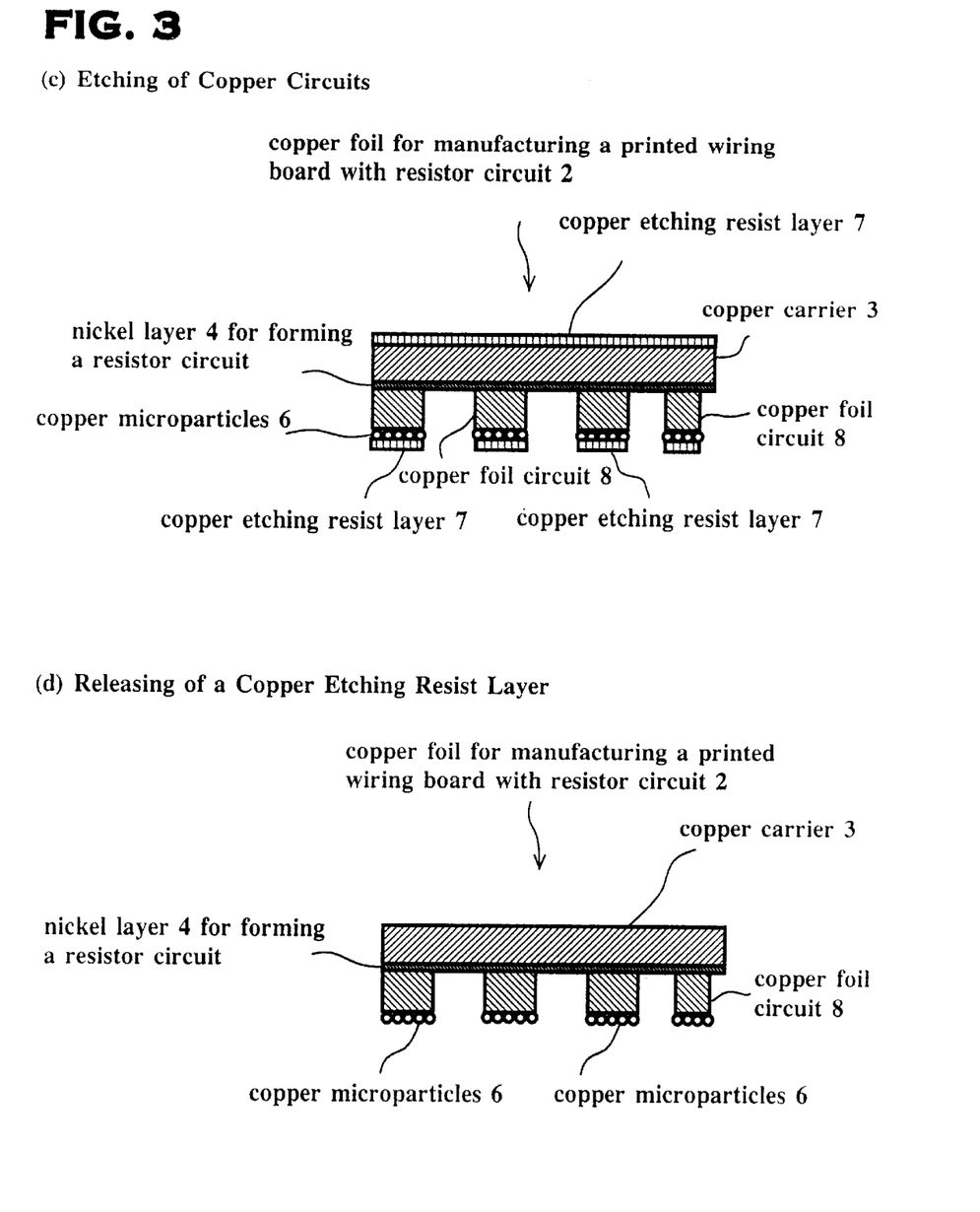

Thereafter, the copper foil layer for forming the circuit is etched with a copper etching solution that does not dissolve the nickel layer or the nickel alloy layer, to form copper foil circuits on the surface of the copper foil layer for forming the resistor circuit. The "copper etching solution that does not dissolve the nickel layer or the nickel alloy layer" used here means an alkaline etching solution for copper. Such an etching solution can etch copper without damaging the nickel layer or the nickel alloy layer. The schematic sectional view of the composite copper foil with carrier after forming the copper foil circuits is shown in FIG. 3(c). After the formation of the copper foil circuits have been completed, the copper etching resist layer is released. The releasing solution used here is a commonly used alkaline resist releasing solution. FIG. 3(d) shows the state after the copper etching resist layer has been released.

Figure 4:
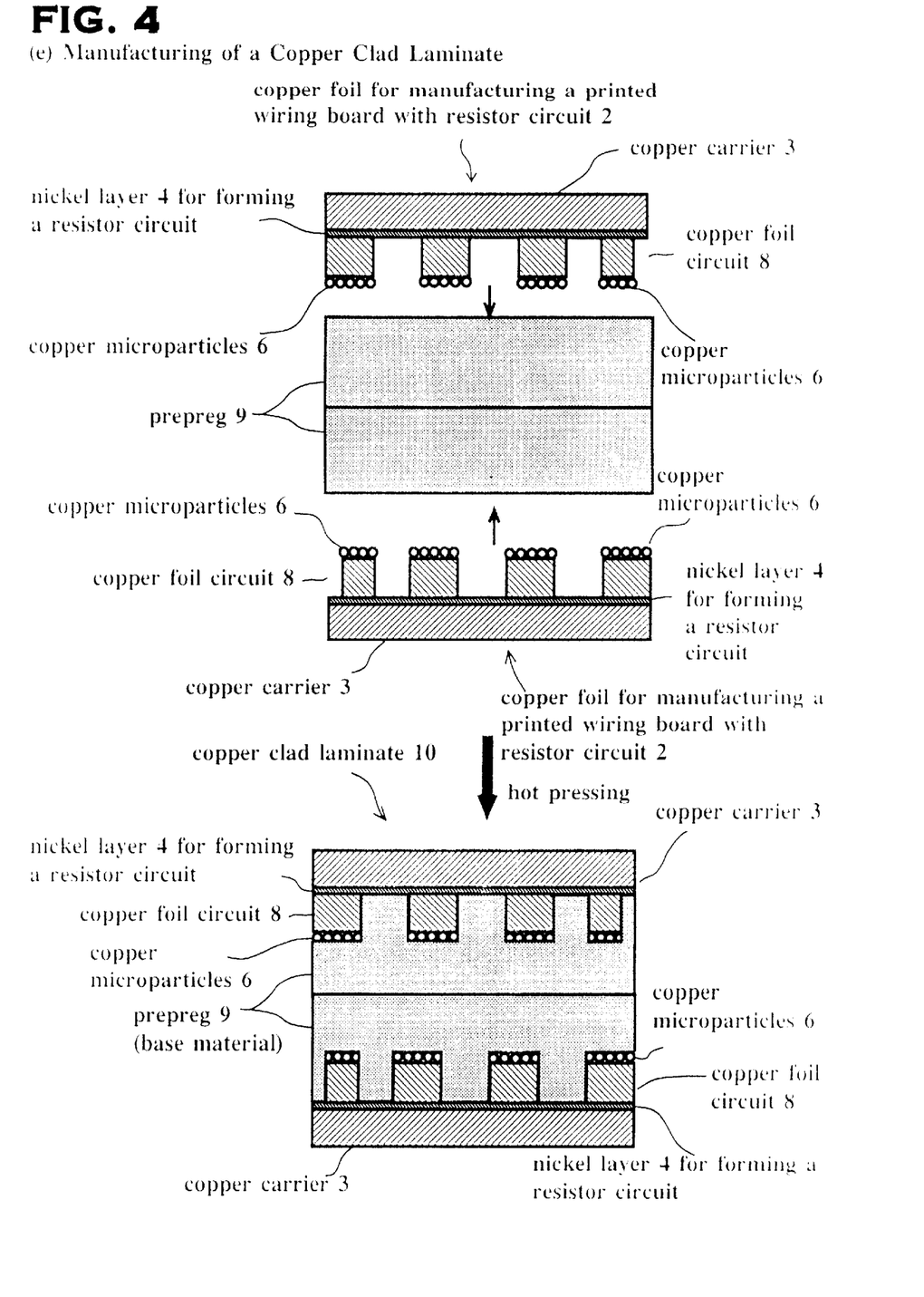

By hot-pressing the composite copper foil with carrier on which the copper foil circuits are formed and an insulating layer composing material for composing a resin base (e.g., prepreg), a copper clad laminate is manufactured. At this time, hot pressing for manufacturing the copper clad laminate is performed in the state shown in FIG. 4(e), so that the surface of the composite copper foil with carrier on which the copper foil circuits have been formed contacts the insulating layer composing material. In FIG. 4(e), the composite copper foil with carrier using two prepreg sheets after forming copper foil circuits is shown on its respective outsides as an example. Therefore, a single-face board or a multi-layer board having three or more layers may be manufactured without any problems.

Figure 5:
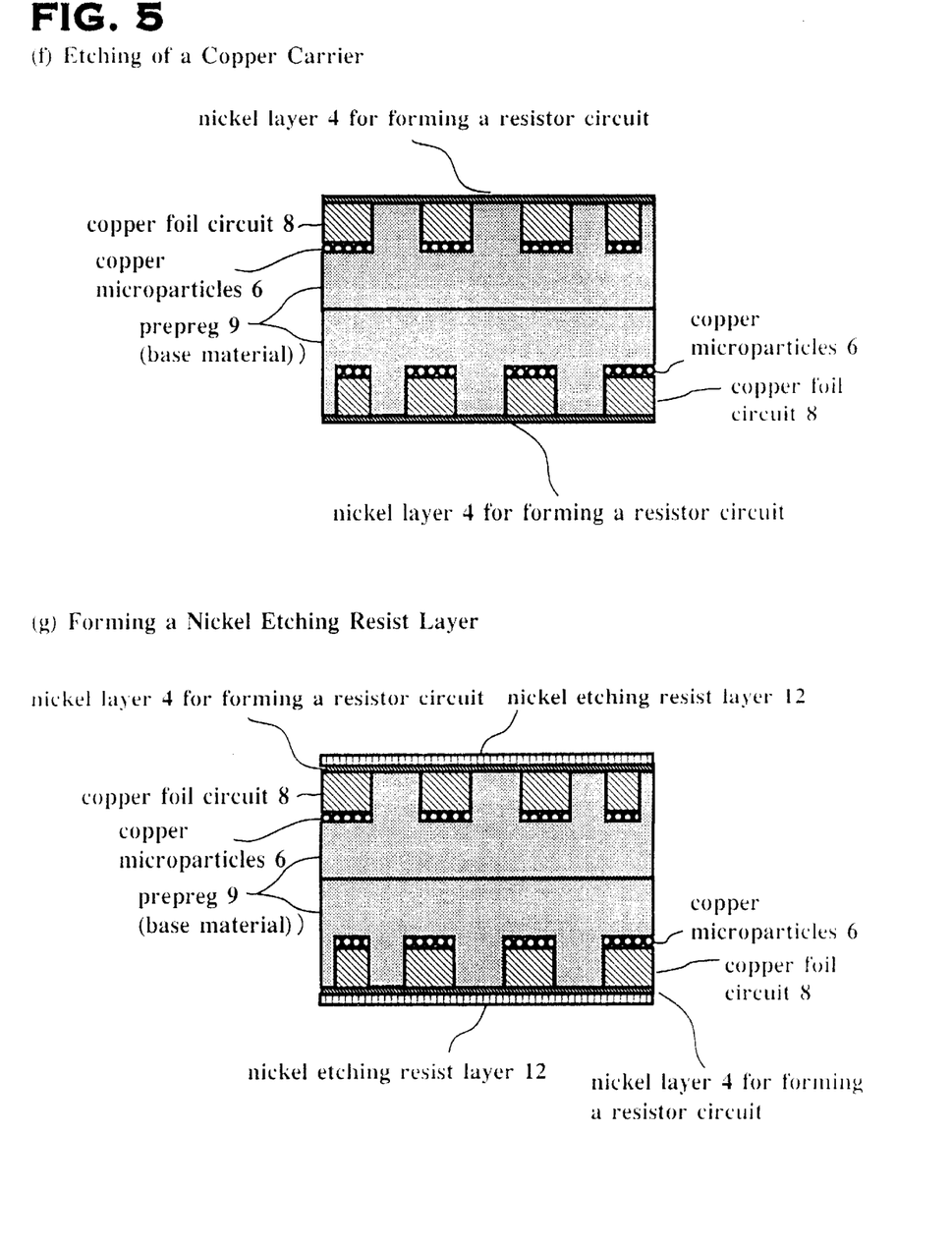

After the manufacture of the copper clad laminate has been completed, the copper carrier to be positioned on the outer layer of the copper clad laminate must be removed to expose the metal layer for forming the resistor circuit. It is important at this time to use an alkaline etching solution for copper using ammonium persulfate or the like, or a mixed solution of sulfuric acid and hydrogen peroxide as the copper etching solution for removing the copper foil used for the carrier, in order to prevent the dissolution of the nickel layer or the nickel alloy layer as the metal layer for forming the resistor circuit, and to etch only copper. This is because if the thickness of the metal layer for forming the resistor circuit is varied, the resistance cannot be controlled accurately. While in the case where the above-described peelable type composite copper foil with carrier is used, the carrier can be removed by releasing. FIG. 5(f) shows the state after the copper foil for the carrier has been removed.

Next, in order to form a resistor circuit, a nickel etching resist layer is formed on the nickel layer or the nickel alloy layer as the metal layer for forming the resistor circuit. FIG. 5(g) shows the state after the nickel etching resist layer has been formed. The nickel etching resist layer at this time is not necessarily a special etching resist layer. The same etching resist layer as the above-described copper etching resist layer can be used.

Figure 6:
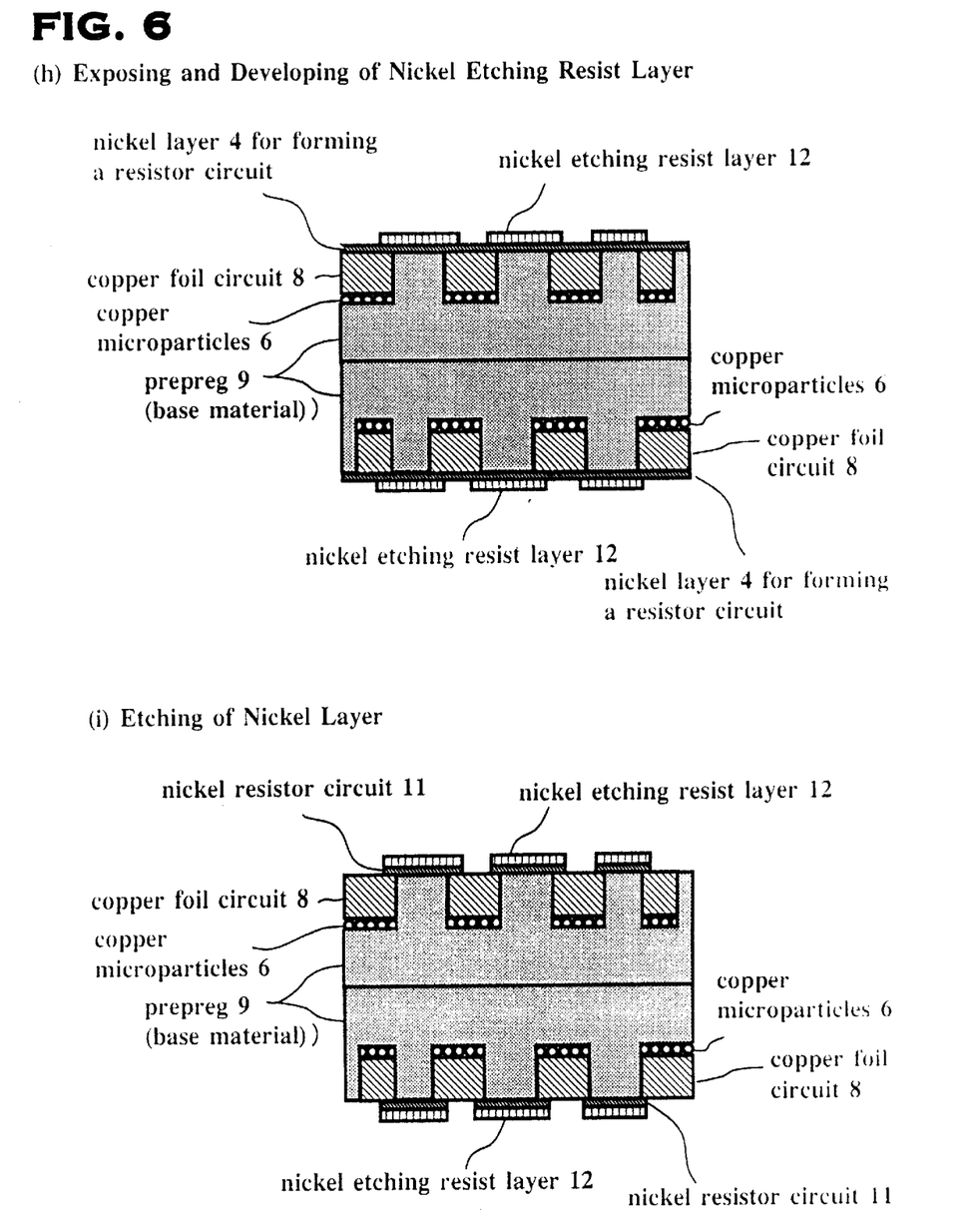

After the nickel etching resist layer has been formed, the resistor circuit pattern of the nickel resistor circuits is exposed and developed. The state after developing is shown in FIG. 6(h).

Figure 7:
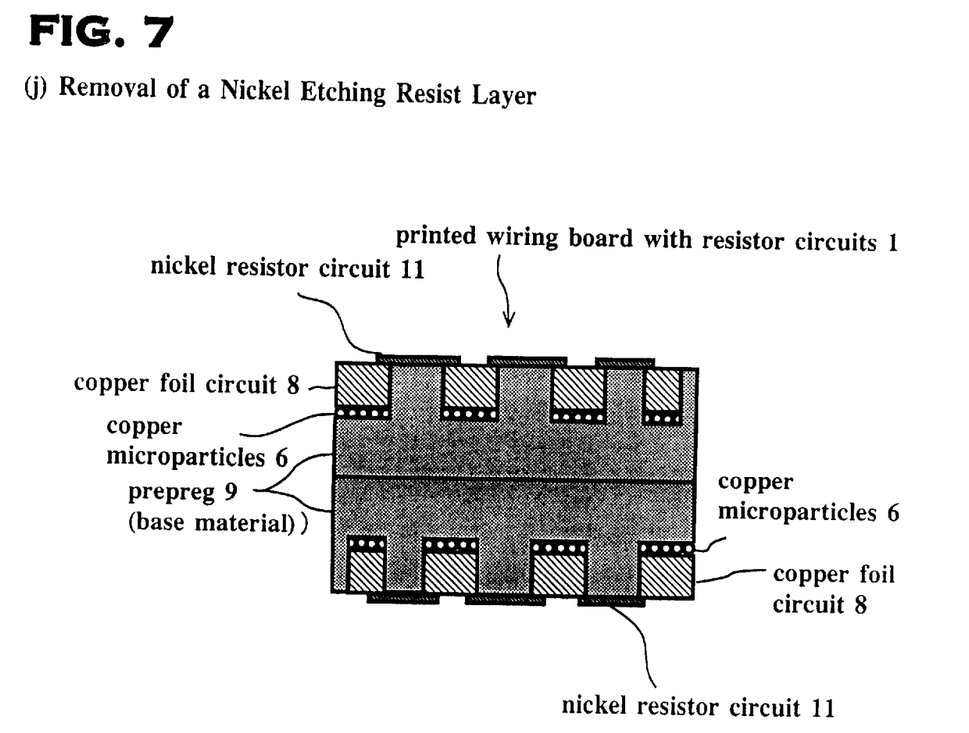

After the development of the nickel etching resist layer has been completed, the resistor circuit is formed by etching. At this time, it is preferable to use a selective nickel etching solution that does not dissolve copper. The state after the resistor circuit has been formed by etching is shown in FIG. 6(i). Finally, as FIG. 7(j) shows, the nickel etching resist layer is removed to form the printed wiring board with resistor circuits according to the present invention.

The term the selective nickel etching solution used herein is a solution to dissolve only nickel or nickel alloys without dissolving copper. The use of such a solution enables the resistor circuit to be manufactured at a high accuracy without damaging the copper circuit. The selective nickel etching solution is preferably any of (i) a sulfuric acid solution between 550 mL/L and 650 mL/L, (ii) a mixed solution of sulfuric acid and nitric acid, or (iii) a mixed solution of sulfuric acid and m-nitrobenzene sulfuric acid as described in claim 5.

The first solution, more preferably the concentration between 580 mL/L and 620 mL/L, is used for cathode-polarizing the copper clad laminate in the solution, and etching out the nickel layer or the nickel alloy layer by electrolysis. The reason why the concentration is decided between 550 mL/L and 650 mL/L is that if the concentration is lower than 550 mL/L, the etching speed is too low for the practical operation; and if the concentration exceeds 650 mL/L, the etching speed does not increase, and the rate of dissolving reaction decreases. The more preferable range, between 580 mL/L and 620 mL/L, is the best range for the etching speed and the stability of the solution quality. For the second and third solutions, there is no limitation in concentrations, and the optimal conditions can be established considering the process.

DETAILED DESCRIPTION OF THE PREFERRED EMBODIMENTS

The present invention will be described below in further detail referring to an embodiment of a printed wiring board 1 with resistor circuits according to the present invention.

This embodiment will be described referring to FIGS. 2 to 7. The composite copper foil with carrier 2 used in this embodiment uses a electrodeposited copper foil having a thickness of 18 µm as a copper carrier 3. A nickel layer 4 for forming the resistor circuit having a thickness of 3 µm is formed on the shiny side of the copper carrier 3 using a so called treater of the copper foil, a copper foil layer 5 for forming the circuit is formed on the nickel layer 4 for forming the resistor circuit, copper microparticles 6 are further deposited, and both surfaces are subjected to the zinc rust prevention treatment. Here, the zinc rust prevention layer is not shown.

Then, as FIG. 2(a) shows, a copper etching resist layer 7 is formed on the surface of the copper foil layer 5 for forming the circuit on which copper microparticles 6 are deposited. For forming the copper etching resist layer 7, a dry film from Nichigo Alpho Co. Ltd. was used. As FIG. 2(b) shows, a circuit pattern for forming copper foil circuits 8 formed on the copper etching resist layer 7 was exposed and developed. At this time, as FIGS. 2(a) and 2(b) show, a copper etching resist layer 7 is also formed on the entire surface of the copper carrier 3 using the same dry film.

Thereafter, copper foil circuits 8 were formed on the surface of the composite copper foil with carrier 2 by etching the copper foil layer 5 for forming the circuit from the surface on which copper microparticles 6 are deposited using an alkaline copper etching solution. FIG. 3(c) shows a schematic sectional view of the composite copper foil with carrier 2 after the copper foil circuits 8 have been formed.

After the formation of the copper foil circuits 8 has been completed, the copper etching resist layer 7 is released. The releasing solution used herein was a commercially available alkaline resist releasing solution. The state after the removal of the copper etching resist layer 7 has been completed is shown in FIG. 3(d).

A copper clad laminate 10 is manufactured by hot-pressing the composite copper foil with carrier 2 on which the copper foil circuits 8 are formed, and prepreg 9 composing the resin base. At this time, the surface of the composite copper foil with carrier 2 on which the copper foil circuits 8 was disposed so as to contact the prepreg 9, and these were laminated and compressed as shown in FIG. 4(*e*). At this time, as FIG. 4 (*e*) shows, 2 sheets of prepreg 9 were used, and a composite copper foil with carrier after copper foil circuits 8 had been formed was disposed on each outer side of the prepreg 9 to form a double-sided board. Although the term prepreg is generally used to express the state before curing, and the term base material or insulating base material is used to express the state after curing, the term prepreg is used either before curing or after curing for the ease of explanation in this embodiment.

After the manufacture of the copper clad laminate 10 had been completed, the copper foil carrier 3 positioned on the outer layer of the copper clad laminate 10 was etched off to expose the nickel layer 4 for forming the resistor circuit. At this time, an ammonium persulfate solution was used as the copper etching solution so as to prevent the dissolution of the nickel layer 4 for forming the resistor circuit. FIG. 5(*f*) shows the state after the copper foil layer 3 for the carrier has been removed.

Next, a nickel etching resist layer 12 is formed on the nickel layer 4 for forming the resistor circuit 11. The state after the nickel etching resist layer 12 has been formed is shown in FIG. 5(*g*). Here, the same etching resist layer as the above-described copper etching resist layer 7 was used as the nickel etching resist layer 12.

After the formation of the nickel etching resist layer 12 had been completed, the resistor circuit pattern of the nickel resistor circuits 11 was exposed and developed. FIG. 6(*h*) shows the state after developing.

After the development of the nickel etching resist layer 12 had been completed, the nickel resistor circuits 11 were removed by etching using a selective nickel etching solution. As the selective nickel etching solution, a sulfuric acid solution prepared by adding 600 mL of special-grade sulfuric acid in 1 L of ion-exchanged water, and the structure as shown in FIG. 6(*i*) was obtained.

Finally, the nickel etching resist layer 12 was removed as shown in FIG. 7(*j*) using a commercially available etching resist releasing solution to form the printed wiring board with resistor circuits 1. The printed wiring board with resistor circuits 1 thus obtained had an excellent stability of circuit width as the circuit accuracy, and the accuracy of the completed resistor circuits was satisfactory. However, in order to make the nickel resistor circuits 11 on the completed printed wiring board with resistor circuits 1 more accurate, the present inventors improved the linearity of the edges of the with laser processing to finish the printed wiring board with resistor circuits 1.

INDUSTRIAL APPLICABILITY

The use of the composite copper foil with carrier according to the present invention, and the adoption of the above-described method for manufacturing a printed wiring board with resistor circuits have enabled a printed wiring board with resistor circuits that has the accuracy of completed circuits superior to conventional printed wiring boards to be manufactured. Therefore, the control of the resistor circuits becomes easy, and the applicable area of printed wiring boards with resistor circuits has been expanded dramatically.

What is claimed is:

1. A composite copper foil with a carrier for manufacturing a printed wiring board with resistor circuits, comprising a metal layer for forming the resistor circuit between a copper carrier and a copper foil layer for forming the circuit, wherein said metal layer for forming the resistor circuit consists essentially of a nickel alloy layer which consists essentially of nickel and at least one component selected from the group consisting of phosphorus, boron, sulfur, titanium, vanadium, chromium, manganese, iron, cobalt, zinc, molybdenum, tungsten, tin and antimony, wherein the thickness of said nickel alloy layer is 0.01 µm to 4 µm, and wherein said composite copper foil further comprises copper microparticles which have been deposited on a surface of the copper foil layer.

2. A printed wiring board comprising a composite copper foil which comprises a carrier, a nickel alloy layer for forming a resistor circuit, wherein said nickel alloy layer consists essentially of nickel and at least one component selected from the group consisting of phosphorus, boron, sulfur, titanium, vanadium, chromium, manganese, iron, cobalt, zinc, molybdenum, tungsten, tin and antimony, and a copper foil layer having copper microparticles deposited opposite to the side having said nickel alloy layer, wherein the thickness of said nickel alloy layer is 0.01 µm to 4 µm, said printed wiring board is obtained by:

forming a copper etching resist layer on the surface of said copper foil for forming the circuit of the composite copper foil with a carrier, and exposing and developing the circuit pattern of the copper foil circuits to be formed on said copper etching resist layer, forming the copper foil circuits by etching the copper foil for forming the circuit using a copper etching solution that does not dissolve the nickel alloy layer, removing the copper etching resist layer, fabricating a copper clad laminate by laminating and hot-pressing the composite copper foil with the carrier and a material for composing an insulating layer in the state where the surface of the composite copper foil with a carrier on which the copper foil circuits are formed contacts the insulating layer composing material, removing the carrier positioned on the outer layer of said copper clad laminate to expose the nickel alloy layer for forming the resistor circuit, forming a nickel etching resist layer on said nickel alloy layer, and exposing and developing the resistor circuit pattern, forming the resistor circuit by using an etching solution for nickel alloy, and removing the nickel etching resist layer.

3. A method for manufacturing a printed wiring board with resistor circuits comprising copper foil circuits and resistor circuits, said method using a composite copper foil which comprises a carrier, a nickel alloy layer for forming a resistor circuit, wherein said nickel alloy layer consists essentially of nickel and at least one component selected from the group consisting of phosphorus, boron, sulfur, titanium, vanadium, chromium, manganese, iron, cobalt, zinc, molybdenum, tungsten, tin and antimony, and a copper foil layer having copper microparticles disposed opposite to the side having said nickel alloy layer, wherein the thickness of said nickel alloy layer is 0.01 µm to 4 µm, and said method comprising the steps of:

forming a copper etching resist layer on the surface of said copper foil for forming the circuit of the composite copper foil with a carrier, and exposing and developing the circuit pattern of the copper foil circuits to be formed on said copper etching resist layer, forming the copper foil circuits by etching the copper foil for forming the circuit using a copper etching solution that does not dissolve the nickel alloy layer, removing the copper etching resist layer, fabricating a copper clad laminate by laminating and hot-pressing the composite copper foil with a carrier and a material for composing an insulating layer in the state where the surface of the composite copper foil with a carrier on which the copper foil circuits are formed contacts the insulating layer composing material, removing the carrier positioned on the outer layer of said copper clad laminated to expose the nickel alloy layer for forming the resistor circuit, forming a nickel etching resist layer on said nickel alloy layer, and exposing and developing the resistor circuit pattern, forming the resistor circuit by using an etching solution for nickel alloy, and removing the nickel etching resist layer.

4. The method for manufacturing a printed wiring board with resistor circuits according to claim 3, wherein said etching solution for nickel alloy is a selective etching solution that does not dissolve copper, selected from:

(i) a sulfuric acid solution between 550 ml/l and 650 ml/l, (ii) a mixed solution of sulfuric acid and nitric acid, or (iii) a mixed solution of sulfuric acid and m-nitrobenzene sulfuric acid.

5. The method of claim 3, wherein the nickel alloy layer is electrodeposited onto a surface of either the copper foil layer or the copper carrier.

6. A method for manufacturing a printed wiring board with resistor circuits comprising copper foil circuits and resistor circuits, comprising forming a composite copper foil with a carrier comprising a nickel alloy layer between a copper carrier and a copper foil layer wherein said nickel alloy layer consists essentially of nickel and at least one component selected from the group consisting of phosphorus, boron, sulfur, titanium, vanadium, chromium, manganese, iron, cobalt, zinc, molybdenum, tungsten, tin and antimony, and said copper foil layer having copper microparticles disposed opposite to the side having said nickel alloy layer, wherein the thickness of said nickel alloy layer is 0.01 $\mu$m to 4 $\mu$m, the method comprising the steps of:

forming a copper etching resist layer on a surface of said copper foil for forming the circuit of the composite copper foil with a carrier, and exposing and developing a circuit pattern of the copper foil circuits to be formed on said copper etching resist layer, forming the copper foil circuits by etching the copper foil for forming the circuit using a copper etching solution that does not dissolve the nickel alloy layer, removing the copper etching resist layer, fabricating a copper clad laminate by laminating and hot-pressing the composite copper foil with a carrier and a material for composing an insulating layer in the state where the surface of the composite copper foil with a carrier on which the copper foil circuits are formed contacts the insulating layer material, removing the copper carrier positioned on the outer layer of said copper clad laminate to reveal the nickel alloy layer for forming the resistor circuit, forming a nickel etching resist layer on said nickel alloy layer, and exposing and developing a resistor circuit pattern on the nickel etching resist layer, forming a resistor circuit by etching the nickel alloy layer using an etching solution for nickel alloy, and removing the nickel etching resist layer.

7. The method according to claim 6, wherein said etching solution for nickel alloy is a selective etching solution that does not dissolve copper, comprising:

(i) a sulfuric acid solution between 550 ml/l and 650 ml/l, (ii) a mixed solution of sulfuric acid and nitric acid, or (iii) a mixed solution of sulfuric acid and m-nitrobenzene sulfuric acid.

8. The method of claim 6 wherein one or more surfaces of at least one of the copper foil layer and the copper carrier are treated with an oxidation prevention treatment.

9. A printed wiring board comprising a composite copper foil which comprises a copper carrier, a copper foil layer comprising copper microparticles which have been deposited on a surface of the copper foil layer, and a nickel alloy layer between the copper carrier and the copper foil layer wherein said nickel alloy layer consists essentially of nickel and at least one component selected from the group consisting of phosphorus, boron, sulfur, titanium, vanadium, chromium, manganese, iron, cobalt, zinc, molybdenum, tungsten, tin and antimony, wherein the thickness of said nickel alloy layer is 0.01 $\mu$m to 4 $\mu$m, said printed wiring board is obtained by:

forming a copper etching resist layer on a surface of said copper foil for forming the circuit of the composite copper foil with a carrier, and exposing and developing a circuit pattern of the copper foil circuits to be formed on said copper etching resist layer, forming the copper foil circuits by etching the copper foil for forming the circuit using a copper etching solution that does not dissolve the nickel alloy layer, removing the copper etching resist layer, fabricating a copper clad laminate by laminating and hot-pressing the composite copper foil with a carrier and a material for composing an insulating layer in the state where the surface of the composite copper foil with a carrier on which the copper foil circuits are formed contacts the insulating layer material, removing the copper carrier positioned on the outer layer of said copper clad laminate to reveal the nickel alloy layer for forming the resistor circuit, forming a nickel etching resist layer on said nickel alloy layer, and exposing and developing a resistor circuit pattern on the nickel etching resist layer, forming a resistor circuit by etching the nickel alloy layer using an etching solution for nickel alloy, and removing the nickel etching resist layer.

* * * * *